United States Patent [19]
Rex

[11] 4,153,474
[45] May 8, 1979

[54] SOLAR ENERGY COLLECTOR

[75] Inventor: Dietrich Rex, Brunswick, Fed. Rep. of Germany

[73] Assignee: Erno Raumfahrttechnik GmbH, Bremen, Fed. Rep. of Germany

[21] Appl. No.: 751,120

[22] Filed: Dec. 16, 1976

[30] Foreign Application Priority Data

Dec. 19, 1975 [DE] Fed. Rep. of Germany ....... 2557296

[51] Int. Cl.² ......................................... H01L 31/04
[52] U.S. Cl. ................................. 136/89 PC; 350/294
[58] Field of Search ........................ 136/206, 89 PC; 126/270, 271; 62/2; 350/294

[56] References Cited

U.S. PATENT DOCUMENTS

| | | | |
|---|---|---|---|
| 3,023,257 | 2/1962 | Fritts | 136/206 |
| 3,350,234 | 10/1967 | Ule | 136/89 PC |
| 3,929,510 | 12/1975 | Kittl | 136/206 |
| 3,982,527 | 9/1976 | Cheng et al. | 126/270 |
| 3,999,283 | 12/1976 | Dean et al. | 136/89 PC |
| 4,023,368 | 5/1977 | Kelly | 136/89 PC |
| 4,045,246 | 8/1977 | Mlavsky et al. | 136/89 PC |

FOREIGN PATENT DOCUMENTS 1287760  4/1961  France ..................................... 126/270

*Primary Examiner*—Maynard R. Wilbur
*Assistant Examiner*—Lawrence Goodwin
*Attorney, Agent, or Firm*—Smyth, Pavitt, Siegemund, Jones & Martella

[57] ABSTRACT

A solar panel is constructed from plural parabolic-cylindrical mirrors arranged side by side, and each mirror has three functions. Its concave ground focusses solar energy, its convex rear carries a strip-like solar cell being thereby disposed close to the focal line of the adjacent mirror, while the rest of the rear surface and possibly also the ground surface dissipates thermal energy.

10 Claims, 4 Drawing Figures

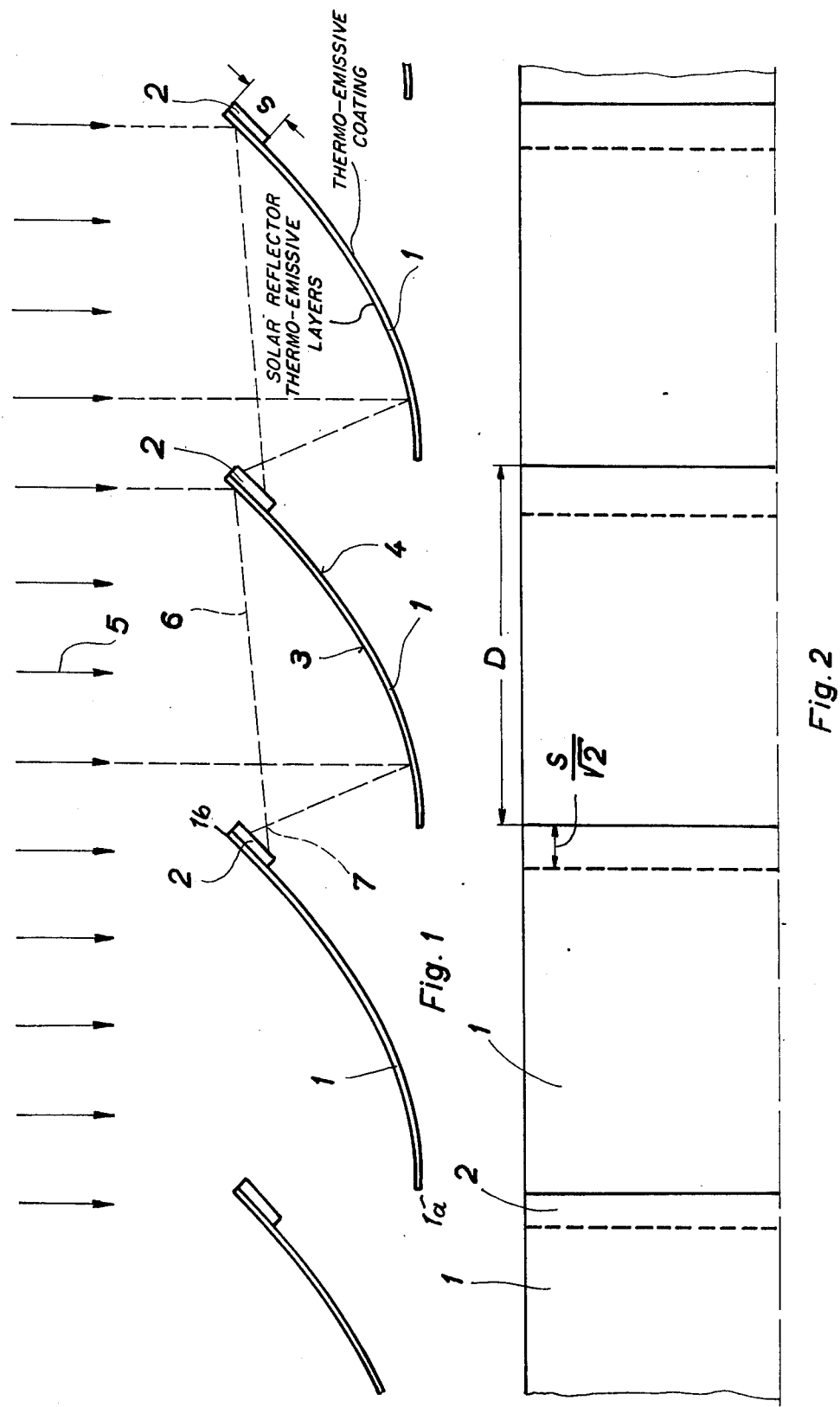

SOLAR ENERGY COLLECTOR

BACKGROUND OF THE INVENTION

The present invention relates to the collection of solar energy by means of mirrors which direct solar radiation onto solar cells for purposes of generating electrical energy.

Satellites, space probes, space stations or other space vehicles are frequently equipped with so-called solar panels wherein solar radiation is converted into electrical energy by means of solar cells, and the generated electric energy is used to furnish the vehicle with operating power. These solar panels are, for example, constructed in that a frame made of metal or fiber reinforced plastic holds a substrate constructed as honeycomb plate or as a glass fiber re-inforced foil. The substrate carries the solar cells which may be bonded thereto. The panels are oriented to intercept the solar radiation as close as possible to a right angle for receiving as much radiation power as is possible per unit area. In outer space, the maximum amount is 1.4 kilowatts per square meter.

The cells have a particular mass or weight per unit area of exposure to the sun and they exhibit a particular efficiency. Also, these cells have a cost basis which can be expressed as per unit area of captured radiation (assumed to be the maximum in each instance). One can, therefore, calculate a particular power output per unit weight factor or parameter, and one can also calculate particular cost amount per unit power output under consideration of complete coverage of a radiation receiving area by solar cells. These values or factors are presently about 9.9 kilogram per kilowatt and about $600,000 per kilowatt at a price of a little under $60,000 per square meter for solar cells. It has been proposed to improve these parameters in that the power yield per unit area is increased through concentration of the solar radiation. For example, plane mirrors are arranged on two opposite sides of a large solar panel. These mirrors are inclined by 60° to the solar panel plane and direct thereto additional radiation. The yield was doubled in that fashion as far as captured radiation is concerned. However, the value of mass per unit power and the cost on a per unit power basis could not be correspondingly improved in that manner, because the increased radiation intensity raises the temperature of the solar cells to such an extent that their efficiency drops considerably. In other words, the larger area used for capturing solar radiation did not increase the effective output because the efficiency of producing energy was reduced in the cells on account of raised temperature.

DESCRIPTION OF THE INVENTION

It is an object of the present invention to provide a new and improved solar energy collector construction in which the mass or weight per kilowatt as well as the cost per power unit for the same from which radiation is collected and converted into electrical energy, is reduced.

In accordance with the preferred embodiment of the present invention, it is suggested to use a plurality of mirrors, each having a reflecting front and a rear surface; the mirrors being so arranged that the focal area of the reflecting front of one mirror is close to a portion of the rear surface of a mirror next to it, and that portion carries a solar cell receiving the focussed radiation of the first mentioned mirror while the mirror carrying the cell serves as heat dissipator. Most mirrors in the assembly, thus, serve triple purposes and functions:

(a) focussing radiation,
(b) carrying a solar cell,
(c) dissipating thermal energy.

In the preferred form of practicing the invention, the mirrors have concave cylindrical reflecting surfaces with parabolic or near parabolic cross-section. The respective solar cell is affixed either to an outer edge or in the middle of the rear surface of the respective mirror. That rear surface, to the extent that it is not covered by solar cell material, should carry a layer of high thermal emissivity. Each mirror together with the edge of the mirror next to it, defines a particular aperture area for captying solar radiation. That area over the actual surface area of the solar cell onto which that radiation is focussed, is a ratio that can be made larger than unity. It should certainly be larger than two possible higher than five. Since the cells are quite effectively cooled, their efficiency is hardly impaired by the use of concentrated radiation. Thus, all factors based on unit area of captured radiation are improved accordingly. Particularly the solar cell weight per kilowatt factor is drastically increased, and the cost of such a generator (for a given output of needed electrical power) is reduced accordingly. A parabolic contour is desirable but an approximation suffices because too strong a concentration of radiation is not needed nor desirable for reasons of avoiding the generation of hot spots. If the reflecting surface is covered by a layer that is transparent to solar radiation but emits thermal radiation, dissipation of thermal energy is improved further.

DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 1 is a somewhat schematic cross-section view through a solar energy collector constructed in accordance with the preferred embodiment of the invention;

FIG. 2 is a top elevation of the collector shown in FIG. 1;

Figure 3:
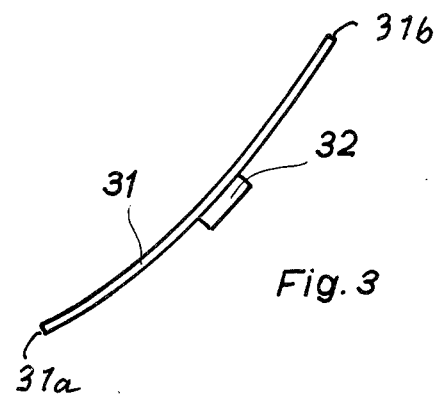
FIG. 3 shows a detail for a modification of the structure shown in FIGS. 1 and 2.

Proceeding now to the detailed description of the drawings, the figures show a plurality of mirror strips 1 which are cylindrical mirrors with parabolic cross-section. The parabola is defined by the equation $y^2 = 2px$ wherein the ordinate x runs in the direction of the incoming radiation 5. p is a constant of e.g. 6 cm and y, of course, is the coordinate direction transversely to the axis x as well as to the cylinder axis of the mirrors, that latter axis extending transversely to the plane of the drawing of FIG. 1.

The edge 1a of a mirror just about coincides with the apex of the parabola and, therefore, can be regarded as x=0 point. The edge 1b is located at a point given by $x = \frac{1}{2} \cdot (p + S\sqrt{2})$ wherein S is a particular width dimension. Specifically, the rear side 4 of each mirror is provided with a solar cell strip 2 extending for the length of the mirror in the direction of the cylinder axis and having a width S.

Each solar cell 2 is affixed to the respective mirror for good thermal conduction particularly from the cell to the mirror material. The back surface 4 of each mirror strip 1 is preferably provided with a layer which has a very high coefficient of emissivity particularly for the expected temperature of the strip 1 so that, in fact, each such strip serves as a cooling vane for the respective solar cell. Solar energy not converted into electrical energy is, thus, radiated out of the system.

Each mirror has a concave reflecting surface 3 which has as high a reflectivity as possible. However, that reflecting layer may be covered by a layer that is transparent to solar radiation, but has a high emissivity for the expected temperature of the mirror, so that also this surface serves for heat dissipation through radiation.

The arrangement, therefore, is constituted by a set of such mirrors which are all directed and oriented to receive solar radiation 5, each mirror capturing a portion and focusses that portion in a focal area, i.e. a line 7 (extending parallel to the cylinder). Diverging radiation from each such focal line is fully intercepted by the solar cell on the back surface of the next mirror in the assembly.

It can be seen that direct placement of the solar cell into the focal line is not desirable because radiation is concentrated too much. Thus, the cells 2 are slightly out-of-focus. Since such strict focussing is, therefore, not used, one does not need a parabolic mirror, but a spherical or other curved approximation may suffice. However, it should be noted that the radiation field edges as intercepted and redirected by the reflector onto cell 2 should be sharply delineated to fully use the surface of that cell 2 as uniformly as possible. For this reason, a parabolic mirror or close approximation is indeed preferred.

FIG. 2 demonstrates how the concentration of solar radiation can be expressed as the ratio of the geometric receiver width D and of the width S of the respective solar cell strip.

In view of the double function of each mirror strip as focussing reflector and as a cooling vane, the solar cells are maintained quite cool in spite of the concentration of radiation upon them. Thus, their efficiency remains (as compared with use for intercepting unfocussed solar radiation) almost unimpaired. The amount of the solar cell material per unit area of intercepted radiation is actually reduced by the ratio of S/D. Due to the fact that the efficiency of each cell is hardly reduced, the weight per kilowatt parameter is increased accordingly by that ratio. In other words, for a given needed kilowatt output the weight in solar cell material is reduced, not quite by the ratio S/D because of other facts, but the reduction is quite closely related to the S/D ratio. Since the cost of the solar cell material is the dominating cost component in the price of the solar panel as a whole; the cost is reduced accordingly. That cost is the price of needed solar cells per unit area of captured radiation or it can be expressed in cost per kilowatt output.

In the specific example of FIG. 1, the ratio D/S may be about 5.5. The temperature of the solar cells can be maintained at about 370° Kelvin and the weight per power factor was only 6.1 kg/kw while the cost was reduced to about $145,000 per kilowatt (or less than one fourth of the per kilowatt price when the area of captured radiation equals the area covered by solar cells).

In the modification shown in FIG. 3, the location of the solar cell, here denoted by 32, has been changed. The cross-sectional contour of the mirror strip 31 is again a portion of a parabola $y^2 = 2px$. One edge, 31a, is located at a point $x = p/8$, the other edge, 31b, is located at a point $x = p$. The cell 32 is affixed to about the middle of the rear surface of strip 31. The depth of the arrangement in the y-direction is somewhat larger than in the case of FIG. 1, but the cooling function of the strip 31 is improved because heat can flow from solar cell strip 32 in both directions. It was found to be advantageous to reduce the thickness of the mirror 1 or 31 slightly toward the outer edges 1a or 31a and 31b.

Figure 4:
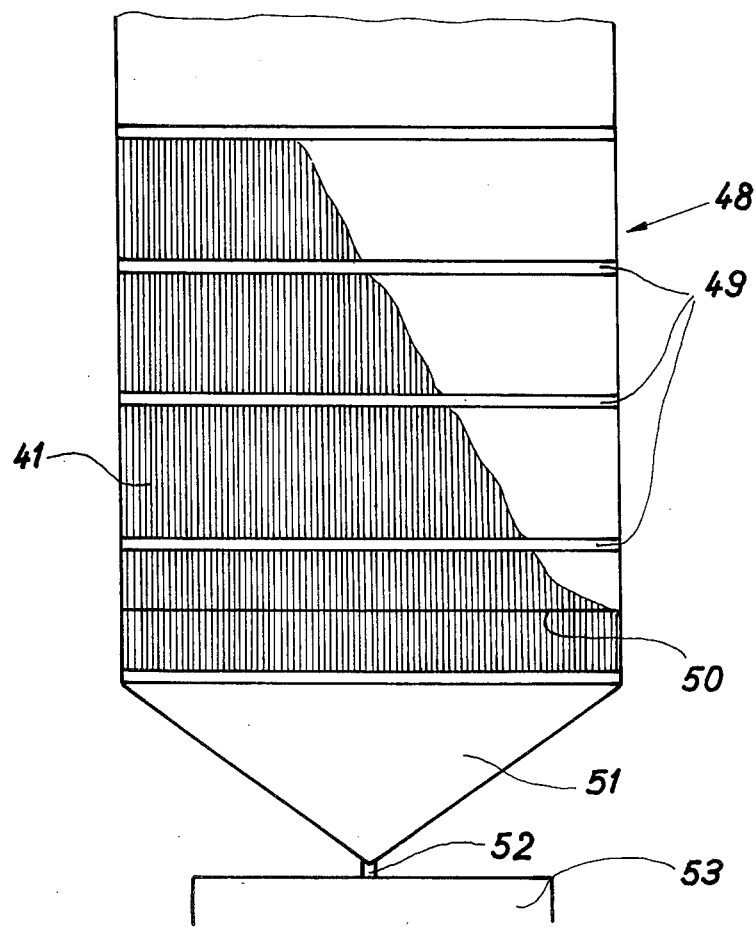
FIG. 4 is a schematic overall front view of a solar panel that incorporates the structure of FIGS. 1, 2 and-/or 3.

FIG. 4 illustrates the front view of a solar panel constructed in accordance with the invention. A frame 48 contains a large plurality of mirror strips 41 of the type shown in FIGS. 1 to 3, whereby the respective solar cells can be situated as shown in FIGS. 1, 2 or in FIG. 3. The panel is divided into frame portions whereby cross bars 49 hold the mirror strips. It will be understood further that the first mirror of each row does not carry a solar cell strip, while a solar strip must be appropriately affixed to the frame adjacent to the last one of these mirrors. The mirrors 41 should be mounted to the frame and cross bars so that any dimensional changes due to heating be duly compensated. Thin bars 50 provide additional support for the mirror strips.

The frame 48 is affixed to a holder 51 which is connected to a turning shaft for purposes of orienting the panel. The mounting may include an articulated joint to permit greater freedom in the adjustment of the panel. Reference numeral 53 represents schematically the space vehicle.

The invention has been explained with reference to utilizing solar energy on a space vehicle, as that poses the most stringent environment. Of course, the invention can also be practiced for generating solar energy on earth.

The invention is not limited to the embodiments described above but all changes and modifications thereof not constituting departures from the spirit and scope of the invention are intended to be included.

I claim:

1. Collector of solar energy for generating electrical energy without requiring convective cooling, comprising:

a plurality of concave mirrors each having a concave reflecting surface and a conversely curved rear surface, not being in heat exchange relation with a cooling fluid, said mirrors arranged side by side so that a portion of the convex rear surface of a first mirror of the plurality is adjacent a focal area of a second mirror of the plurality next to the first mirror; and a strip-shaped photoelectric solar energy cell affixed to said surface portion of said first mirror receiving radiation as focussed by the second mirror for directly generating electrical energy, a flat side of the cell being in thermal conductive relation with said first mirror said mirror having a thermal emissive surface so that the first mirror serves as radiation vane to dissipate thermal energy exclusively by radiation.

2. Collector as in claim 1, wherein said mirrors have parabolic cross-section.

3. Collector as in claim 2, wherein the parabola follows an equation $y^2 = 2px$, wherein x is a direction of the incoming radiation energy, y is a transverse direction, also transverse to a cylinder axis of the respective mirror and p is a geometric parameter.

4. Collector as in claim 3, whereby an edge of the first mirror is located at a position $x = \frac{1}{2} \cdot (p + S\sqrt{2})$, wherein S is the width of the solar cell, the cell is disposed along said edge.

5. Collector as in claim 3, wherein a first edge of the first mirror is located at a position $x = P/8$ and a second edge is located at a position about $x = p$, and the solar cell is disposed in about the middle between the first and second edges, along a cylinder axis.

6. Collector as in claim 1, wherein said mirrors are cylindrical mirrors, the focal areas being line-shaped accordingly.

7. Collector as in claim 1, said rear surface being provided with a layer to enhance radiation emissivity.

8. Collector as in claim 1, the solar cell having a particular width in a direction extending transversely to the axial extension of the cell, the second mirror defining an effective aperture given by a dimension in the direction of axial extension and by a dimension in the direction transversely thereto, the ratio of the latter dimension over said width being larger than two.

9. Collector as in claim 1, said reflecting surface being covered by a layer that is transparent to solar radiation but having a large emissivity at the temperature of the mirror.

10. Collector as in claim 1, said mirrors being thinner towards a respective outer edge.

* * * * *